(12) United States Patent
Lee

(10) Patent No.: US 9,877,382 B2
(45) Date of Patent: Jan. 23, 2018

(54) DISPLAY DEVICE

(71) Applicant: SAMSUNG DISPLAY CO., LTD., Yongin, Gyeonggi-Do (KR)

(72) Inventor: Hee-Kwon Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 661 days.

(21) Appl. No.: 14/338,324

(22) Filed: Jul. 22, 2014

(65) Prior Publication Data

US 2015/0230331 A1    Aug. 13, 2015

(30) Foreign Application Priority Data

Feb. 10, 2014   (KR) .......................... 10-2014-0015106

(51) Int. Cl.
| | |
|---|---|
| *H02H 1/00* | (2006.01) |
| *H02H 1/04* | (2006.01) |
| *H02H 3/22* | (2006.01) |
| *H02H 9/06* | (2006.01) |
| *H05K 1/02* | (2006.01) |
| *H05K 1/09* | (2006.01) |
| *H05K 1/18* | (2006.01) |

(52) U.S. Cl.
CPC ........... *H05K 1/0259* (2013.01); *H05K 1/028* (2013.01); *H05K 1/0298* (2013.01); *H05K 1/092* (2013.01); *H05K 1/189* (2013.01); *H05K 2201/10128* (2013.01)

(58) Field of Classification Search
CPC .... G02F 1/1345; H05K 1/115; H05K 1/0254; H05K 1/028

USPC ......................................................... 361/220
See application file for complete search history.

(56) References Cited

U.S. PATENT DOCUMENTS

| | | | | |
|---|---|---|---|---|
| 7,388,641 | B2 * | 6/2008 | Kim .................... | G02F 1/13452 349/149 |
| 2005/0088830 | A1 * | 4/2005 | Yumoto .............. | G02F 1/13452 361/749 |
| 2011/0128485 | A1 * | 6/2011 | Kim ...................... | G02F 1/1345 349/122 |

(Continued)

FOREIGN PATENT DOCUMENTS

| | | |
|---|---|---|
| JP | 3129997 U | 3/2007 |
| JP | 2012-084800 A | 4/2012 |
| KR | 10-2005-0104801 A | 11/2005 |

(Continued)

*Primary Examiner* — Thienvu Tran
*Assistant Examiner* — Lucy Thomas
(74) *Attorney, Agent, or Firm* — Lewis Roca Rothgerber Christie LLP

(57) ABSTRACT

Provided is a display device including: a display panel; a chip on film (COF) coupled to the display panel; a flexible printed circuit board (FPCB) coupled to the chip on film, the flexible printed circuit board including a plurality of conductive layers and a plurality of insulating layers, the insulating layers being interposed between the conductive layers or being located at opposite sides of the flexible printed circuit board; and a protecting sheet at one side of the display panel and including a conductive region. One of the insulating layers at one side of the flexible printed circuit board is an opening region of the one of the insulating layers and exposes a corresponding one of the conductive layers to at least partially contact the conductive region.

13 Claims, 12 Drawing Sheets

(56) References Cited

U.S. PATENT DOCUMENTS

2012/0092838 A1* 4/2012 Kitano ................. H05K 1/0215
361/749
2014/0355227 A1* 12/2014 Lim ....................... H05K 1/028
361/749

FOREIGN PATENT DOCUMENTS

KR    10-2008-0097778 A    11/2008
KR    10-2013-0075730 A     7/2013

* cited by examiner

DISPLAY DEVICE

CROSS-REFERENCE TO RELATED APPLICATION

This application claims priority to and the benefit of Korean Patent Application No. 10-2014-0015106 filed in the Korean Intellectual Property Office on Feb. 10, 2014, the entire contents of which are incorporated herein by reference.

BACKGROUND (a) Field

Aspects of example embodiments of the present invention relate to a display device.

(b) Description of the Related Art

Display devices include liquid crystal displays (LCD), organic light emitting diode (OLED) displays, etc. Particularly, the organic light emitting diode display includes a display substrate that provides a display area and a non-display area, and an encapsulation substrate disposed to face the display substrate for encapsulation, the encapsulation substrate being bonded with the display substrate by a sealant such as an epoxy.

A plurality of light emitting elements included in pixels formed at crossings of scans line and data lines in the display area of the display substrate are connected in a matrix form. A scan driver and a data driver formed in the non-display area extend from the scan lines and the data lines in the display area, process signals provided through a pad from the outside, and supply the signals to the scan lines and the data lines.

The scan driver and the data driver include a driving circuit that processes the signals provided from the outside and produces scan signals and data signals, and are mounted on the display substrate after being formed in a manufacturing process for the light emitting element or after being manufactured as a separate integrated circuit chip.

An anti-static circuit may be provided on a panel to protect it from being damaged by static electricity introduced into the display device.

However, as the display device, such as a wearable display device and the like, becomes smaller, a distance between signal wires and an anti-static circuit becomes closer and thus, even the static electricity introduced into the anti-static circuit may damage the signal wires.

Accordingly, overall driving defects of the display panel may occur, and thus, studies on a robust anti-static design are desirable to protect the anti-static circuit from a burst damage phenomenon, as well as to prevent the display panel from malfunctioning and being damaged.

The above information disclosed in this Background section is only for enhancement of understanding of the background of the invention, and therefore, may contain information that does not form the prior art that is known to a person of ordinary skill in the art.

SUMMARY

Aspects of example embodiments of the present invention relate to a robust anti-static design that is capable of stably discharging static electricity introduced into a display device.

A display device according to an example embodiment of the present invention provides a robust anti-static design, and includes: a display panel; a chip on film (COF) coupled to the display panel; a flexible printed circuit board (FPCB) coupled to the chip on film, the flexible printed circuit board including a plurality of conductive layers and a plurality of insulating layers, the insulating layers being interposed between the conductive layers or being located at opposite sides of the flexible printed circuit board; and a protecting sheet at one side of the display panel and including a conductive region. One of the insulating layers at one side of the flexible printed circuit board is an opening region of the one of the insulating layers and exposes a corresponding one of the conductive layers to at least partially contact the conductive region.

The protecting sheet may include a cushion sheet having an insulating property.

The conductive region may be at one side of the protecting sheet.

The insulating layers may be at opposite sides of the flexible printed circuit board and may include polyimide films.

The insulating layers may have a plurality of via-holes.

The flexible printed circuit board may include: a protruding portion that overlaps the chip on film; and a body part comprising circuit elements and being coupled to the protruding portion. The opening region may be at the protruding portion.

The display device may further include a driving circuit on the chip on film, wherein the protruding portion comprises a plurality of protruding portions, and the driving circuit may be between the plurality of protruding portions.

The opening region may be configured to guide static electricity introduced into the opening region toward a ground wire at the body part.

One end of the protecting sheet may include the conductive region and may protrude further than that of the display panel.

The opening region may include a plurality of opening regions at the opposite sides of the flexible printed circuit board.

The plurality of opening regions may be at a corner of the flexible printed circuit board.

Resistances of the conductive layers may be smaller than that of the conductive region.

The conductive region may include a fabric and a metallic paste.

The conductive layers may include at least one of copper (Cu), nickel (Ni), or gold (Au).

The display device may further include a chassis at the display panel, wherein the opening region may be configured to guide static electricity introduced into the opening region toward the chassis.

Accordingly, the display device described above may prevent damage or malfunction of the panel or the driving circuit due to introduced static electricity, and may also provide a robust anti-static design for allowing a moving path through which the static electricity is stably introduced and is discharged.

Aspects of embodiments of the present invention relate to a display device having a robust anti-static design for a small display device and the like in which sufficient space is generally not available.

DETAILED DESCRIPTION

Figure 1:
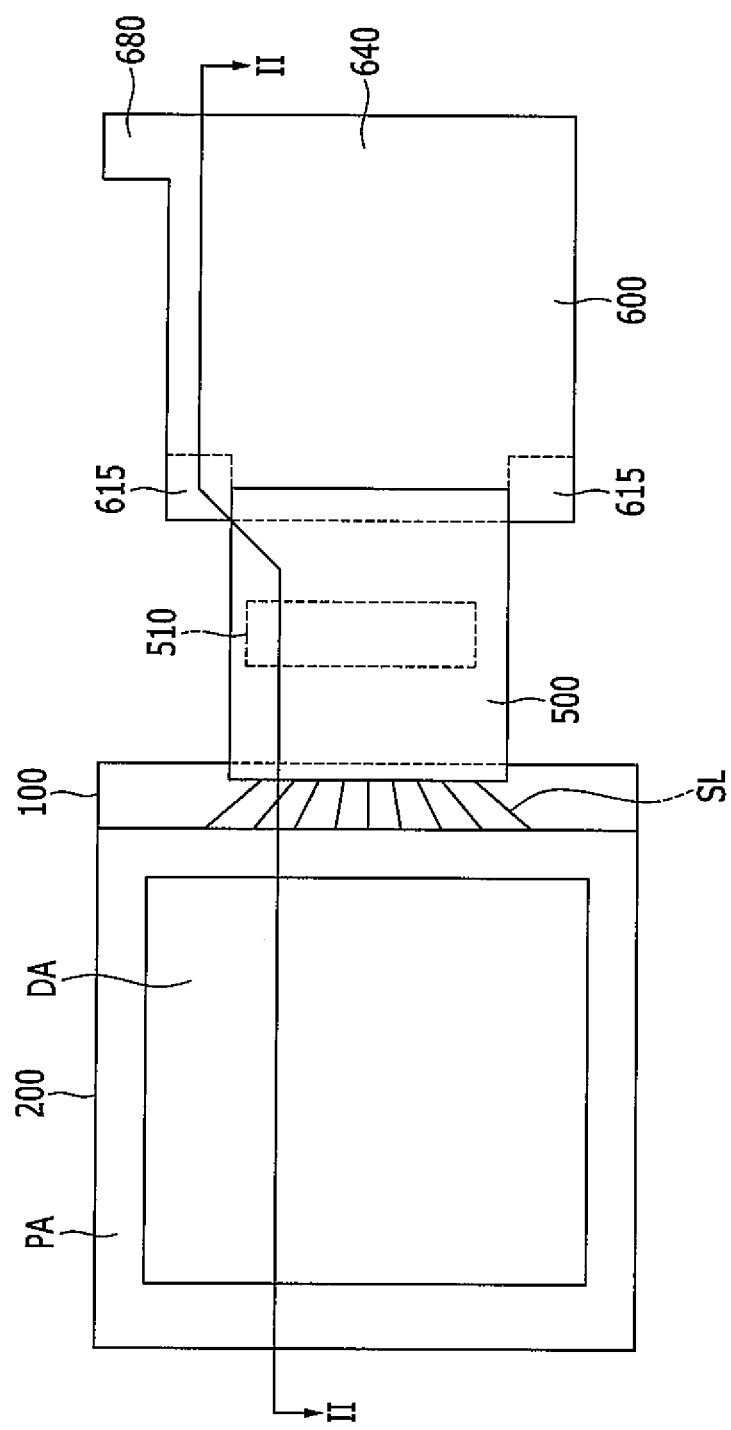
FIG. 1 is a top plan view of a display device in an unfolded state according to an example embodiment of the present invention.

Hereinafter, aspects of example embodiments of the present invention will be described in detail with reference to the attached drawings such that the present invention can be put into practice by those skilled in the art.

As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element.

In addition, unless explicitly described to the contrary, the word "comprise" and variations such as "comprises" or "comprising" will be understood to imply the inclusion of stated elements but not the exclusion of any other elements.

In addition, in the following description, a chip on film (COF) is described as an example, but the present invention is not limited thereto, and a tape carrier package (TCP), for example, may be alternatively used instead of the chip on film (COF).

The chip on film (COF) and the tape carrier package (TCP) are both bendable types having a flexible property, and are similar to each other in that a circuit is mounted on a base material having a plate shape.

The chip on film differs from the tape carrier package in that it is formed of a transparent film while the latter is formed of an opaque material, and they can both be used as a connecting material for a display panel or a printed circuit board.

Accordingly, in example embodiments in which the chip on film is used hereinafter, the tape carrier package may be used instead.

First, a display device according to an example embodiment of the present invention will be described with reference to FIGS. 1 to 3.

Figure 2:
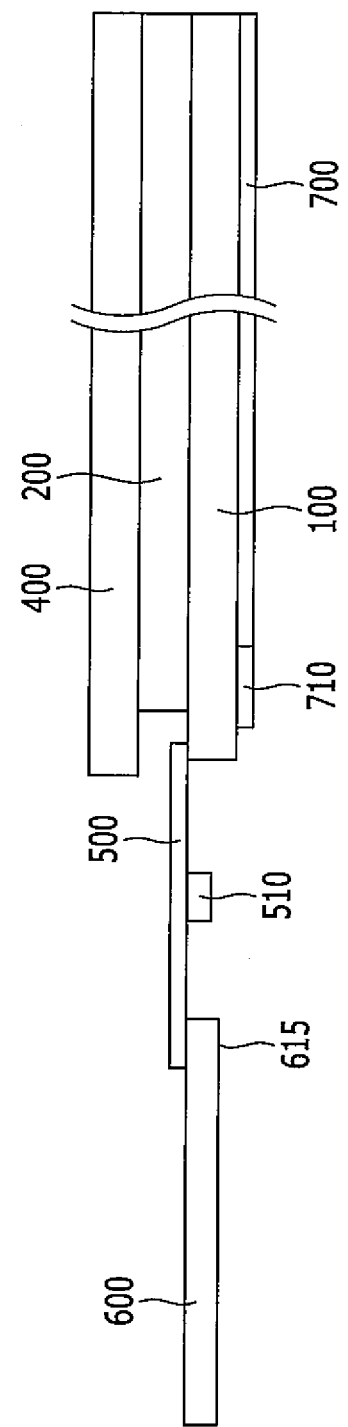
FIG. 2 is a cross-sectional view of FIG. 1 taken along the line II-II.
Figure 3:
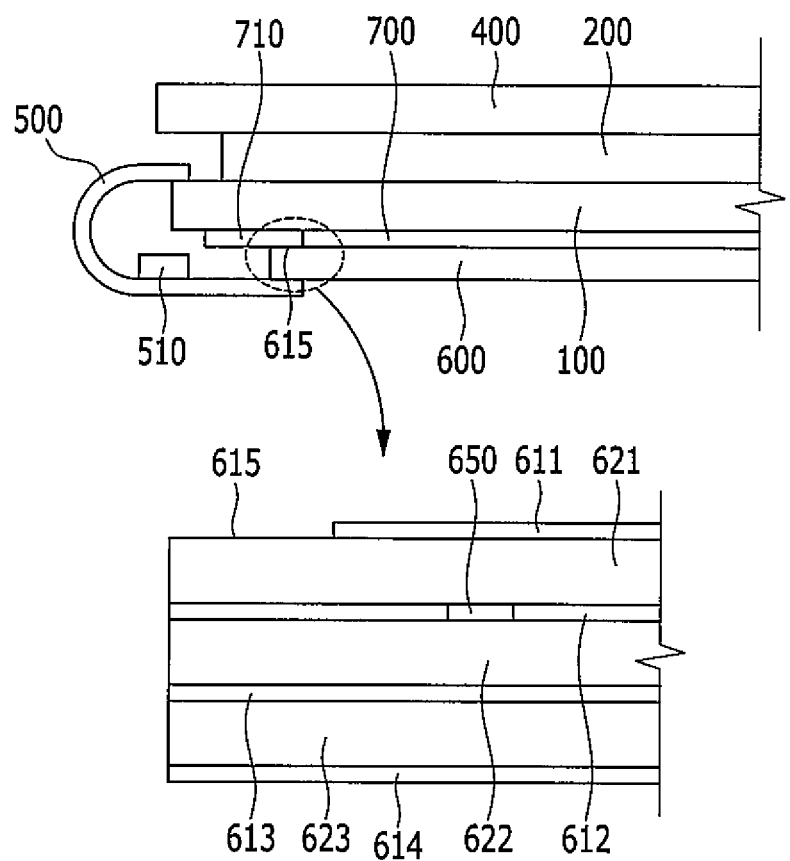
FIG. 3 is a cross-sectional view of the display device of FIG. 1 in a folded state and a partial enlarged view thereof.

FIG. 1 is a top plan view of a display device in an unfolded state according to an example embodiment of the present invention, FIG. 2 is a cross-sectional view of FIG. 1 taken along the line II-II, and FIG. 3 is a cross-sectional view of the display device of FIG. 1 in a folded state and a partial enlarged view thereof.

That is, FIG. 1 shows the display device before the chip on film and the flexible printed circuit board (FPCB) are bent to be attached to a rear side of the display panel.

As shown in FIG. 1, the display device according to the described example embodiment of the present invention includes: a display panel including a display layer 200 and a lower substrate 100; a chip on film (COF) 500 coupled (e.g., connected) to one end of the lower substrate 100; a flexible printed circuit board (FPCB) 600; and a protecting sheet 700 positioned at the rear side (e.g., bottom surface) of the display panel as shown in FIG. 2.

When viewed from a plane (e.g., top horizontal plane of the display panel), the display panel includes a display area DA for displaying an image and a peripheral area PA positioned at a periphery of the display area DA.

A plurality of pixels are disposed at the display area DA. Each pixel includes a thin film transistor (TFT), a capacitor that will be described later, and an electro-optical active layer.

In addition, a plurality of display signal lines SL for transmitting driving signals are positioned at the display area DA, and the display signal line SL includes a gate line for transmitting a gate signal and a data line for transmitting a data signal.

The display signal line SL is elongated towards the peripheral area PA to form a pad portion on the lower substrate 100.

The display layer 200 includes a plurality of pixels, and the plurality of display signal lines SL are coupled to the pixels and formed on the lower substrate 100. The display signal lines SL transmit the display signals to the pixels.

The pixels and display signal lines will be described below in more detail with reference to FIGS. 9 to 11.

The display panel including the lower substrate 100 and the display layer 200 may be a flexible substrate.

In addition, a window 400 may be located at one side of the display panel including the lower substrate 100 and the display layer 200, and the window 400 may protect the display layer 200 from damage caused by external impacts.

The window 400 may be coupled to the display layer 200 by using an additional adhesion layer (e.g., optically clear adhesive (OCA)), but the present invention is not limited thereto, and the window 400 may be coupled to the display layer 200 by any other suitable coupling member or means known to those skilled in the art.

In example embodiments, a touch panel and the like positioned between the window 400 and the display layer 200 may be further included.

The touch panel senses and outputs a user's contact and the like.

The chip on film 500 is electrically coupled (e.g., electrically connected) to one end of the lower substrate 100, and signal wires are positioned on the chip on film 500 to apply electrical signals to the pixels of the display layer 200.

That is, since the signal wires are formed on the chip on film 500, they can supply the electrical signals through a driving circuit 510.

As shown in FIG. 3, the chip on film 500 may be variously bent because it is made of a flexible material (e.g., film or tape).

When the chip on film 500 is disposed on (e.g.; located at) the same plane as the display layer, the volume of the display device may be increased.

Thus, by using a bendable property of the chip on film 500, the chip on film 500 is bent in a "⊏" shape (or a "u" or "c" shape) along an outer edge of the display layer 200, and then the printed circuit board 600 coupled to the chip on film 500 is positioned on the rear side (e.g., bottom surface) of the display panel.

That is, as illustrated in FIG. 3, during an assembling process of the display device, the printed circuit board is disposed on (e.g., located at) the rear side of the display panel such that it is attached thereto.

The driving circuit 510 is positioned on the chip on film 500, and the driving circuit 510 may include a data driver for applying a data voltage to the data line, a gate driver for applying a gate-on voltage to the gate line, and a signal controller for controlling the data and gate drivers.

One end of the chip on film 500 may be coupled to the lower substrate 100 and another end of the chip on film 500 may be coupled to the flexible printed circuit board 600. In an example embodiment, the flexible printed circuit board 600 is physically and electrically coupled (e.g., connected) to the other end of the chip on film 500 through an anisotropic conductive film (ACF).

When control and data signals are provided to the driving circuit 510 of the chip on film 500 through the flexible printed circuit board 600, the driving circuit 510 generates a scan signal and a data signal, and the driving circuit 510 transmits the generated signals to a light emitting element of the display layer 200 through the scan line and the data line.

Thus, in order to electrically couple (e.g., electrically connect) the display layer 200 with the flexible printed circuit board 600, one side of the chip on film 500 is attached to the lower substrate 100 or the display layer 200, and the other side thereof is attached to the flexible printed circuit board 600.

In an embodiment of the present invention as described above, a part of the lower substrate 100 to which the chip on film 500 is attached is the peripheral area PA rather than the display area DA.

The flexible printed circuit board 600 includes an opening region 615, a body part 640, and a connector part 680.

The opening region 615 is a region in which the flexible printed circuit board 600 is partially opened, that is, a region in which an insulating layer covering the flexible printed circuit board 600 is partially removed.

The opening region 615 will be described below in detail with reference to FIG. 3.

As shown in FIG. 3, the printed circuit board 600 according to an example embodiment of the present invention includes a plurality of insulating layers 611, 612, 613, and 614, and a plurality of conductive layers 621, 622, and 623.

The flexible printed circuit board 600 may include the three conductive layers 621, 622, and 623 with two of the insulating layers 612 and 613 interposed therebetween to insulate them, and two of the insulating layers 611 and 614 positioned on opposite sides (e.g., opposite surfaces) of the flexible printed circuit board 600.

The two insulating layers 611 and 614 positioned on the opposite sides of the flexible printed circuit board 600 may be, for example, polyimide films.

In example embodiments of the present application, the flexible printed circuit board 600 including the three conductive layers has been described, but the present invention is not limited thereto, and the flexible printed circuit board 600 may be any flexible printed circuit board including any number of conductive layers and insulation layers for insulating them.

In the described embodiment, since the chip on film 500 is bent, the insulating layer 611 (e.g., predetermined insulating layer) positioned on one side (e.g., outermost side or surface) of the flexible printed circuit board 600 contacts one side (e.g., surface) of the protecting sheet 700.

Thus, the other side of the protecting sheet 700 contacts the lower substrate 100.

After being positioned on one side of the flexible printed circuit board 600 to face the protecting sheet 700, the insulating layer 611 is partially removed to partially expose the conductive layer 621.

In this case, the region in which the insulating layer 611 is partially removed is referred to as the opening region 615.

As shown in FIG. 3, the opening region 615 overlaps a conductive region 710 that will be described later.

When static electricity flows into the conductive region 710 positioned adjacent to one corner of the display device, the static electricity introduced into the conductive region 710 may flow into the conductive layer 621 through the opening region 615.

The introduced static electricity may be discharged through a wire or a connector to a ground region or a housing coupled thereto.

The insulating layers 612 and 613 according to an example embodiment of the present invention may include via holes 650.

As shown in FIG. 3, the insulating layer 612 positioned between the first and second conductive layers 621 and 622 may include the via hole 650 through which the static electricity can move.

For example, the static electricity introduced through the conductive region 710 and the opening region 615 moves through the first conductive layer 621, and in case the via hole 650 is positioned on a moving path, the static electricity may move to the second conductive layer 622 therethrough.

Thus, the static electricity flowed into the first conductive layer 621 may be distributed to the other conductive layers such that it is more easily discharged.

In an example embodiment, the via hole 650 positioned between the first and second conductive layers 621 and 622 has been described, but the present invention is not limited thereto, and embodiments may further include a via hole 650 positioned between the second and third conductive layers 622 and 623.

According to the example embodiment described above, the static electricity flowed into the first conductive layer 621 may move to the second and third conductive layers 622 and 623 as well as to the first conductive layer 621, thereby making a robust anti-static design inside the display device more effective.

The conductive layers 621, 622, and 623 may contain at least one of metals such as copper (Cu), nickel (Ni), or gold (Au), and resistances of the conductive layers 621, 622, and 623 may be about 0.2 to 0.3 Ω.

The resistances of the conductive layers 621, 622, and 623 may be smaller than that of the conductive region 710, to be described later, such that the static electricity flowed into the conductive layer may more easily flow.

Various circuit elements may be positioned in the body part 640, for example, general signal wires may be positioned therein in addition to wires coupled to a ground wire while including the opening region 615.

In addition, a separate ground electrode or an external element may be coupled to the connector part 680, and as an example, a wire (e.g., predetermined wire) extending from the body part 640 may be elongated thereto.

The protecting sheet 700 is positioned on the lower substrate 100, that is, on the rear side (e.g., bottom surface) of the display panel, and as shown in FIG. 3, the protecting sheet 700 including the conductive region 710 may protrude further than one end of the lower substrate 100 or the display layer 200.

That is, the protecting sheet 700 may be positioned closer to one corner of the display device.

This is because the static electricity flowing into the display device is mainly introduced through corners of the display.

The protecting sheet 700 is formed in a planar shape on an entire surface of the lower substrate 100, and may include a region having an insulating property and the conductive region 710 having a conductive property.

As a kind of cushion sheets, the region of the protecting sheet 700 having the insulating property may protect the display device from impacts applied from the outside.

As a region for enabling the static electricity to move in the display device, the conductive region 710 may be made of, for example, a material including a fabric and a metallic paste.

The conductive region 710 made of such a material may have resistance of about 0.6 to 0.8 Ω.

That is, in an embodiment of the present invention, the conductive region 710 may have greater resistance than the conductive layers 621, 622, and 623 described above.

As such, when the resistances of the conductive region 710 and the conductive layers 621, 622, and 623 through which the static electricity moves are different from each other, a moving time of the static electricity may be delayed, thereby preventing or reducing wire damage caused by rapid movement.

The conductive region 710 is positioned at some region of the protecting sheet 700, for example, at the corners thereof.

This is because, as described above, the static electricity flowing into the display device is introduced through the corners thereof.

The conductive region 710 may allow a part of the protecting sheet 700 to have the conductive property while being integrally formed therewith, or to form a separate conductive region 710 (e.g., refer to FIG. 5) on the protecting sheet 700 having the insulating property.

In example embodiments of the present invention, the separate conductive region 710 is formed with a conductive tape, but the present invention is not limited thereto.

The conductive region 710 may be formed at a region in which the flexible printed circuit board 600 and the protecting sheet 700 contact each other as the chip on film 500 and the flexible printed circuit board 600 are bent.

Thus, the conductive region 710 and the flexible printed circuit board 600 at least partially contact each other, and an example embodiment in which they completely overlap each other may be possible.

When the chip on film 500 and the flexible printed circuit board 600 are bent to be assembled, the protecting sheet 700 entirely covering the lower substrate 100 is partially exposed.

That is, the chip on film 500 and the flexible printed circuit board 600 cover most of the protecting sheet 700 while partially exposing it.

In this case, an exposed region may be the conductive region 710, and the conductive region 710 may be elongated further to the exposed region or some region that overlaps the flexible printed circuit board 600.

Thus, the conductive region 710 may have any shape as long as it performs such a function.

The display device described above may be a small device, for example, like a wearable display device, but the present invention is not limited thereto, and any display device may be provided with the conductive region 710 and the opening region 615, thereby enabling the static electricity introduced therein to be stably discharged therethrough.

Accordingly, the robust anti-static display device may be provided, which prevents or reduces damage to the display panel, the driving circuits, etc.

A display device according to another example embodiment of the present invention will now be described with reference to FIGS. 4 to 6.

Figure 4:
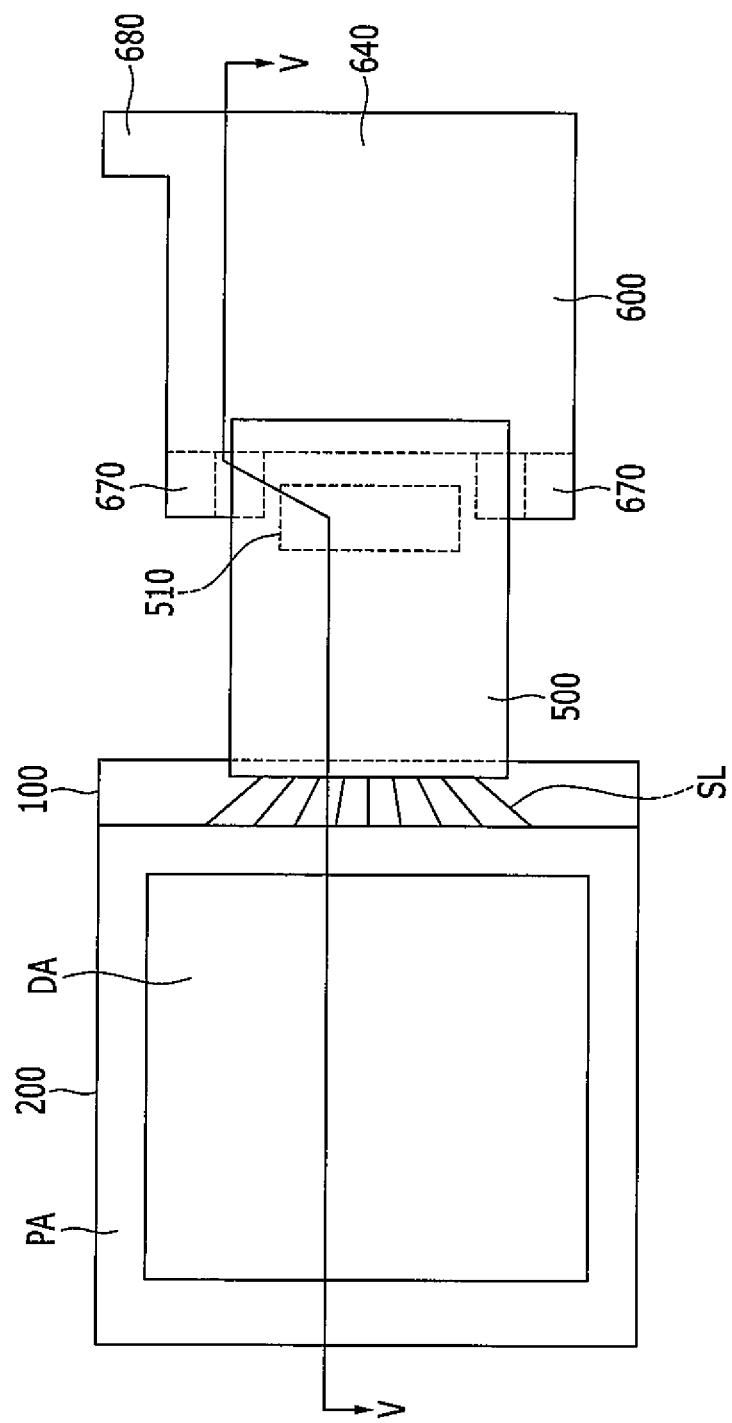
FIG. 4 is a top plan view of a display device in an unfolded state according to another example embodiment of the present invention.
Figure 5:
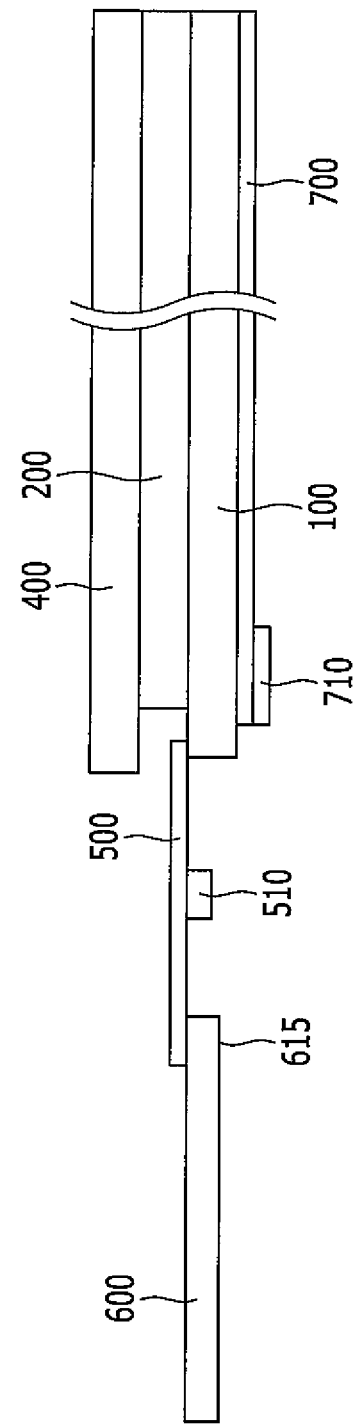
FIG. 5 is a cross-sectional view of FIG. 4 taken along the line V-V.
Figure 6:
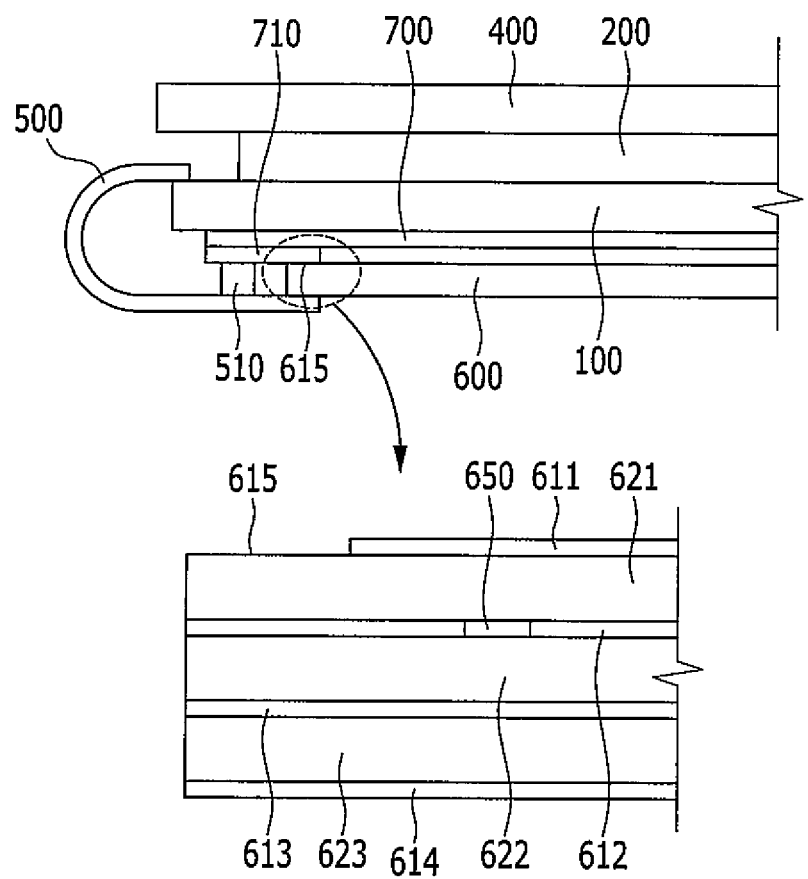
FIG. 6 is a cross-sectional view of the display device of FIG. 4 in a folded state.

FIG. 4 is a top plan view of a display device in an unfolded state according to another example embodiment of the present invention, FIG. 5 is a cross-sectional view of FIG. 4 taken along the line V-V, and FIG. 6 is a cross-sectional view of FIG. 4 in a folded state.

A description of the same or substantially the same constituent elements as those of the example embodiments described above may have been omitted.

A display device according to the described example embodiment of the present invention includes: a display panel including a display layer 200 and a lower substrate 100; a chip on film 500 coupled (e.g., connected) to one end of the lower substrate 100; a flexible printed circuit board (FPCB) 600 coupled to the chip on film 500; and a protecting sheet 700 positioned on a rear side (e.g., bottom surface) of the display panel. The lower panel 100, the display layer 200, and the chip on film 500 according to the described embodiment of the present invention are the same as or similar to those of the example embodiments described above.

However, the display device according to the described example embodiments of the present invention includes the flexible printed circuit board 600 including a protruding portion 670.

The flexible printed circuit board 600 according to an example embodiment of the present invention generally has a quadrangular shape on a plane from which the connector part 680 protrudes at one side, but the flexible printed circuit board 600 according to another example embodiment may further include the protruding portion 670 that is elongated from one end of a corner thereof to protrude toward the chip on film 500.

In embodiments of the present invention, the protruding portion 670 may be formed in various shapes, and an example embodiment in which the protruding portions having the quadrangular shape are positioned at opposite ends of one side of the flexible printed circuit board 600 is illustrated in FIG. 4.

The flexible printed circuit board 600 formed as such may have protrusions and depressions in which a concave region is longer than a convex region (e.g., the protruding portion), and the driving circuit 510 positioned on the chip on film 500 may be positioned in the concave region.

That is, the driving circuit 510 may be positioned between a plurality of protruding portions 670.

An opening region 615 according to the described example embodiment of the present invention may be positioned at the protruding portion 670.

The opening region 615 indicates a region at which the flexible printed circuit board 600 is partially opened, that is, a region where an insulating layer covering the flexible printed circuit board 600 is partially removed.

In other words, an insulating layer 611 positioned at one side of the flexible printed circuit board 600 while facing the protecting sheet 700 is partially removed to expose a conductive layer 621.

In this case, the region at which the insulating layer 611 is partially removed is referred to as the opening region 615, and a position at which the opening region is located is different from the example embodiments of the present invention described above.

Since static electricity is easily introduced through regions such as corners and the like, the opening region 615 positioned at the protruding portion 670 that protrudes toward one corner of the display device may make inflow of the static electricity easier.

The opening region 615 according to the described embodiment overlaps a conductive region 710 that will be described later.

Thus, in case the static electricity flows into the conductive region 710 positioned adjacent to one corner of the display device, the static electricity flowed into the conductive region 710 may be introduced into the conductive layer 621 through the opening region 615.

The static electricity introduced as such is discharged to a ground region or a housing through wires or a connector part coupled thereto.

Insulating layers 612 and 613 may include via holes 650.

The insulating layers 612 and 613 positioned between the adjacent conductive layers may include a plurality of via holes 650 through which the static electricity can move.

Thus, the static electricity introduced into the first conductive layer 621 may move to the second and third conductive layers 622 and 623 as well as the first conductive layer 621, thereby making a robust anti-static design inside the display device more effective.

Further, referring to FIG. 5, unlike the example embodiment as shown in FIG. 2, the protecting sheet 700 according to another example embodiment of the present invention includes the conductive region 710 positioned on one side of the protecting sheet 700.

For example, the conductive region 710 may be a tape, and a conductive tape may be attached on the protecting sheet 700 having a function like a cushion sheet.

In this case, a position to which the conductive tape is attached, and a size thereof, may be the same as or may be different from those of the example embodiments described above.

Despite the smaller size of the device, the display device may be provided with the opening region 615 in which the static electricity is more easily introduced through the conductive region 710 and the protruding portion 670.

Accordingly, the display device having a robust anti-static design can be provided which prevents or reduces damage to the display device, the driving circuits, etc., caused by the static electricity.

A display device according to another example embodiment of the present invention will now be described with reference to FIGS. 7 and 8.

Figure 7:
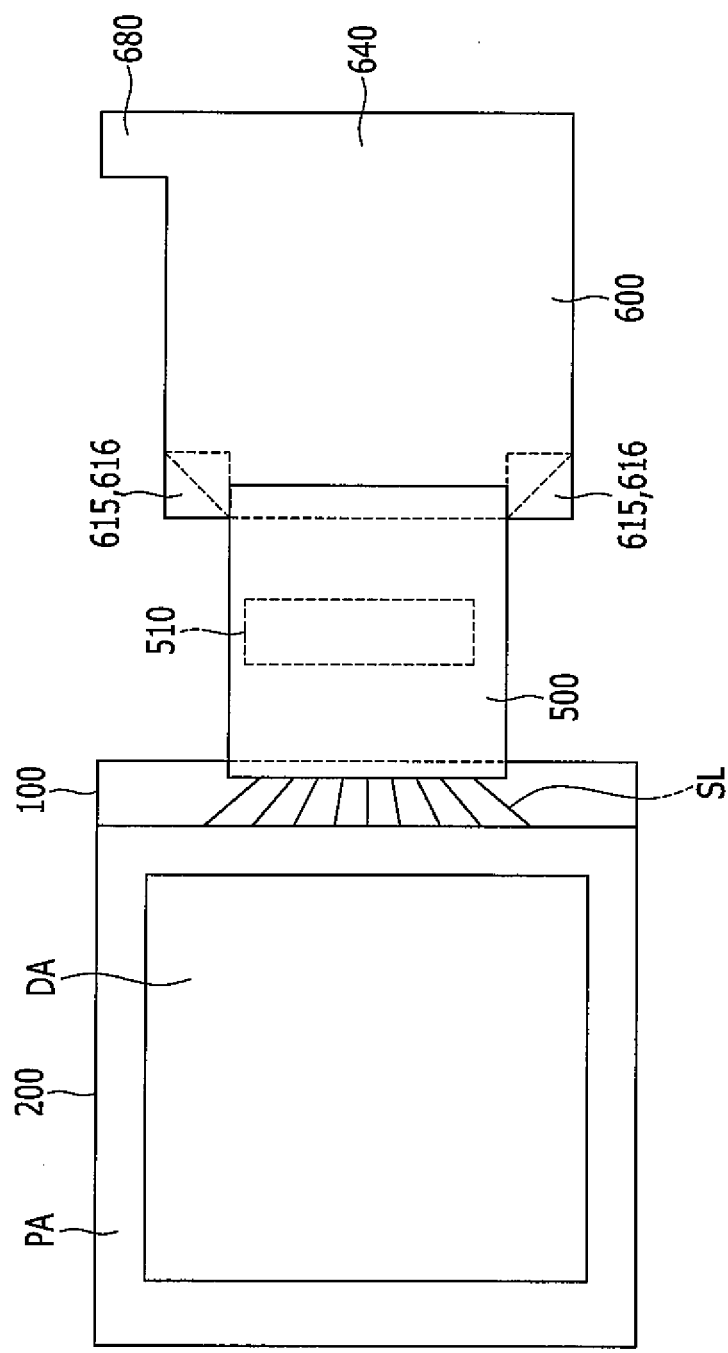
FIG. 7 is a top plan view of a display device in an unfolded state according to another example embodiment of the present invention.
Figure 8:
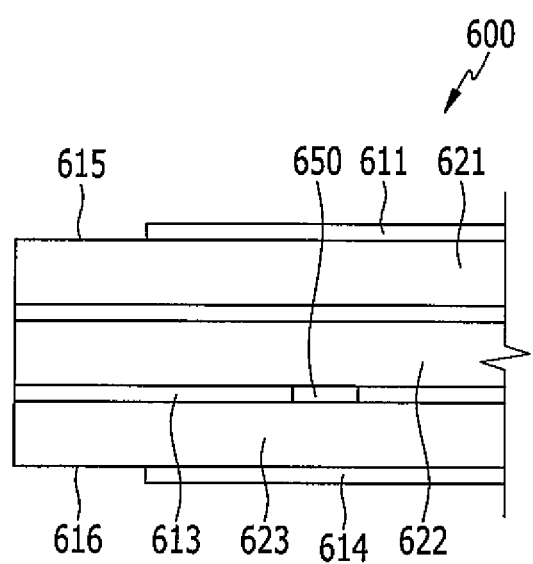
FIG. 8 is a partially enlarged view of a flexible printed circuit board according to the example embodiment of FIG. 7.

FIG. 7 is a top plan view of a display device in an unfolded state according to another example embodiment of the present invention, and FIG. 8 is a partially enlarged view of a flexible printed circuit board according to the example embodiment of FIG. 7.

A description of the same or substantially the same constituent elements as those of the example embodiments described above may have been omitted.

The display device according to the described example embodiment of the present invention includes: a display panel including a display layer 200 and a lower substrate 100; a chip on film 500 coupled (e.g., connected) to one end of the lower substrate 100; a flexible printed circuit board (FPCB) 600 coupled to the chip on film 500; and a protecting sheet 700 positioned on a rear side (e.g., bottom surface) of the display panel.

The lower panel 100, the display layer 200, and the chip on film 500 are the same as or similar to those of the example embodiments described above.

The display device according to the described example embodiment of the present invention includes the flexible printed circuit board 600 including a plurality of opening regions 615 and 616.

Referring to FIG. 8, according to an example embodiment of the present invention, an insulating layer 611 positioned on one side of the flexible printed circuit board 600, as well as an insulating layer 614 positioned on the other side thereof, are partially removed.

When compared with the other example embodiments of the present invention, the other example embodiments describe above include the opening region 615 provided at one side of the flexible printed circuit board 600 that faces the protecting sheet 700, but the example embodiment illustrated in FIG. 8 includes opening regions 615 and 616 that are positioned on opposite sides (e.g., surfaces) of the flexible printed circuit board 600.

In this case, static electricity flowing into the display device is introduced into a first conductive layer 621 through a conductive region 710 and the opening region 615, or is introduced into a third conductive layer 623 through the opening region 616 positioned on the other side.

However, as described above, since the conductive layers 621, 622, and 623 may be internally coupled to each other through the via hole 650, the static electricity flowing into the conductive layers (e.g., predetermined conductive layers) may not only be introduced to a corresponding conductive layer, but may also be distributed to a plurality of conductive layers such that the static electricity is discharged therethrough.

In addition, as illustrated in FIG. 7, the opening regions 615 and 616 may be positioned at corners of the flexible printed circuit board 600, and in an example embodiment, may have pointed corners like a triangle.

This is because the static electricity, as described above, is highly likely to be introduced through the pointed corners.

Despite the small size of the device, since the display device described above has a plurality of regions through which the static electricity is introduced, the static electricity may be stably introduced therethrough, thereby provided the robust anti-static display device which prevents or reduces damage to the display panel, the driving circuits, etc., caused by the static electricity.

The display device described above may be an organic light emitting diode (OLED) display, and such an organic light emitting diode (OLED) display will be described with reference to FIGS. 9 to 11.

Figure 9:
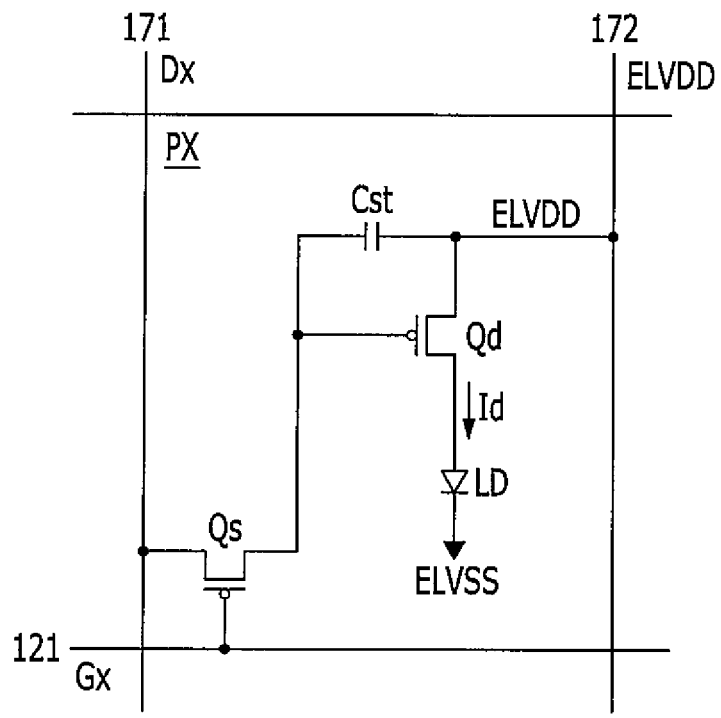
FIG. 9 is an equivalent circuit diagram of a pixel of an organic light emitting diode display according to an example embodiment of the present invention.
Figure 10:
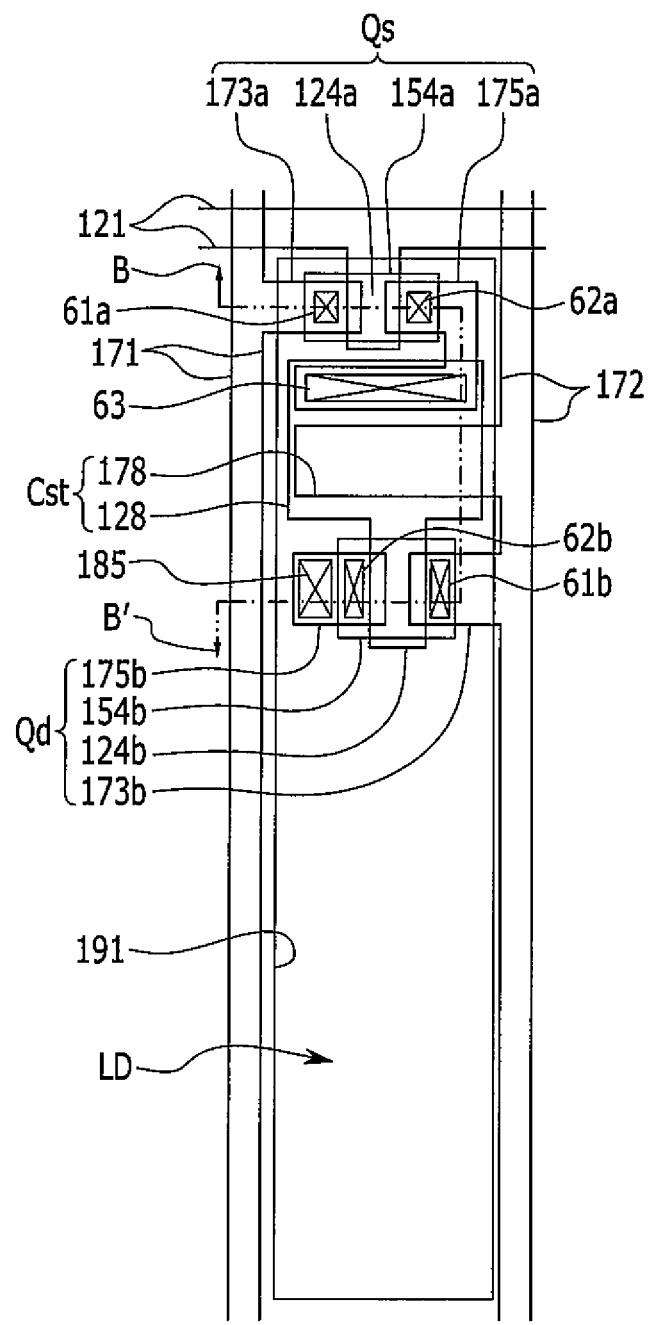
FIG. 10 is a layout view of an organic light emitting diode display according to the example embodiment depicted in FIG. 9.
Figure 11:
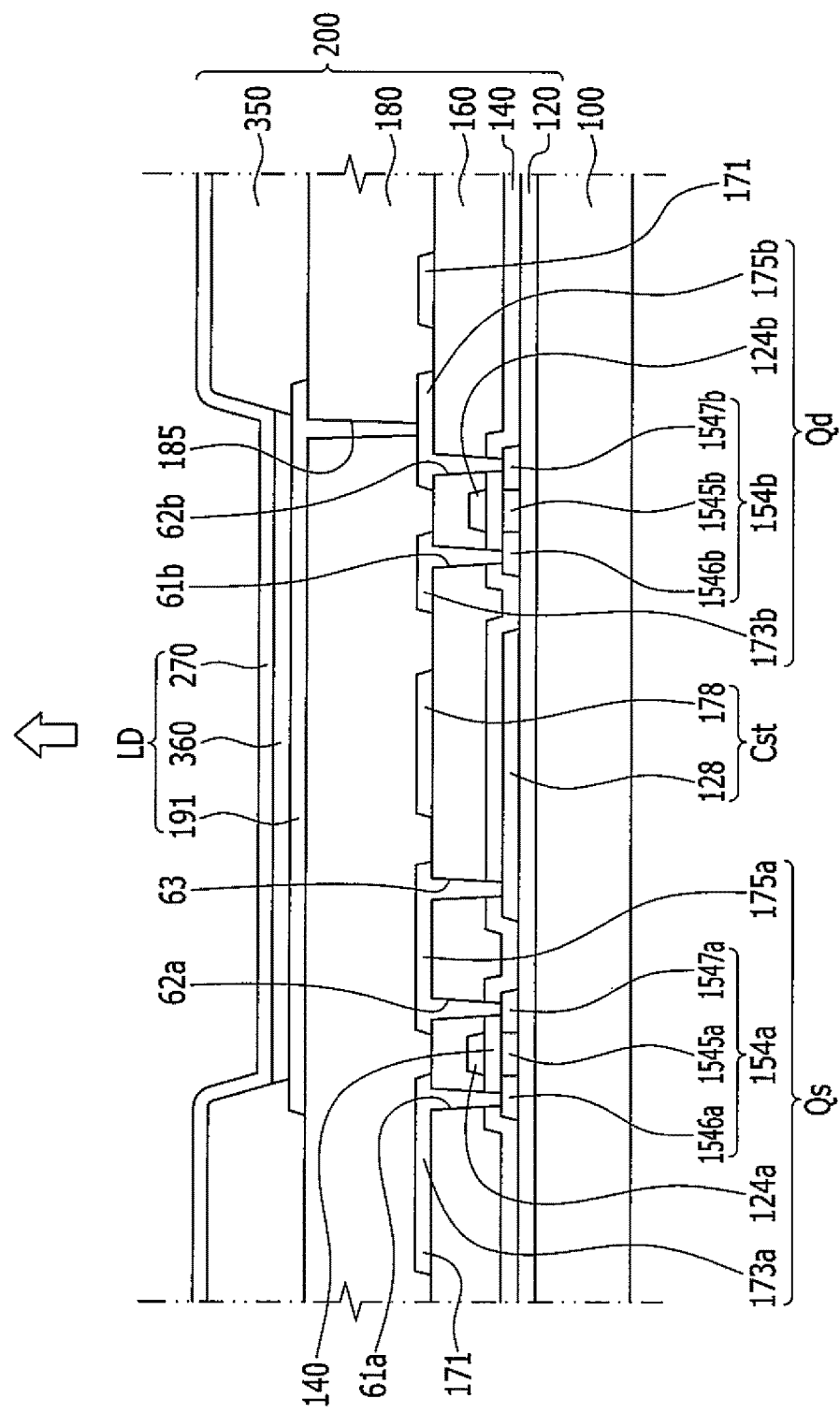
FIG. 11 is a cross-sectional view of FIG. 10 taken along the line B-B'.

FIG. 9 is an equivalent circuit diagram of a pixel of an organic light emitting diode display according to an example embodiment of the present invention, FIG. 10 is a layout view of an organic light emitting diode display according to the example embodiment depicted in FIG. 9, and FIG. 11 is a cross-sectional view of FIG. 10 taken along the line B-B'.

Referring to FIG. 9, an organic light emitting diode display according to the described example embodiment includes a plurality of signal lines 121, 171, and 172, and a plurality of pixels PX that are coupled (e.g., connected) thereto and arranged in substantially a matrix form.

The signal lines include a plurality of gate lines 121 for transmitting a gate signal (or a scan signal), a plurality of data lines 171 for transmitting a data signal, and a plurality of driving voltage lines 172 for transmitting a driving voltage ELVDD.

These gate and data signals are applied from the display driver.

The gate lines 121 extend in a substantially row direction while being arranged substantially in parallel with each other, and the data lines 171 and the driving voltage lines 172 extend in a substantially column direction while being arranged substantially in parallel with each other.

Each pixel PX includes a switching thin film transistor Qs, a driving thin film transistor Qd, a storage capacitor Cst, and an organic light emitting diode LD.

The switching thin film transistor Qs has a control terminal, an input terminal, and an output terminal. The control terminal is coupled to the gate line 121, the input terminal is coupled to the data line 171, and the output terminal is coupled to the driving thin film transistor Qd.

The switching thin film transistor Qs transmits the data signal, which is applied to the data line 171, to the driving thin film transistor Qd in response to the gate signal applied to the gate line 121.

The driving thin film transistor Qd has a control terminal, an input terminal, and an output terminal. The control terminal is coupled to the switching thin film transistor Qs, the input terminal is coupled to the driving voltage line 172, and the output terminal is coupled to the organic light emitting diode LD.

The driving thin film transistor Qd outputs an output current Id of varying magnitude depending on the voltage applied between the control terminal and the input terminal of the driving thin film transistor Qd.

The storage capacitor Cst is coupled between the control and input terminals of the driving thin film transistor Qd.

The storage capacitor Cst is charged with the data signal applied to the control terminal of the driving thin film transistor Qd, and maintains the data signal even after the switching thin film transistor Qs is turned off.

The organic light emitting diode LD includes an anode coupled to the output terminal of the driving thin film transistor Qd, and a cathode coupled to the common voltage ELVSS.

The organic light emitting diode LD displays an image by emitting light with varying intensity according to the output current Id of the driving thin film transistor Qd.

The switching and driving thin film transistors Qs and Qd may be n-channel field effect transistors or p-channel field effect transistors.

In addition, a connecting configuration in which the switching and driving thin film transistors Qs and Qd, the storage capacitor Cst, and the organic light emitting diode LD are interconnected may be varied.

Referring to FIGS. 10 and 11, the organic light emitting diode display according to the described example embodiment includes a lower substrate 100, a thin film display layer 200, and an organic light emitting diode LD.

The substrate 100 may be formed of transparent glass or plastic.

In addition, the substrate 100 may be a flexible substrate.

The thin film display layer 200 includes a buffer layer 120, switching and driving semiconductor layers 154a and 154b, a gate insulation layer 140, gate lines 121, a first storage capacitor plate 128, an interlayer insulation layer 160, data lines 171, driving voltage lines 172, a switching drain electrode 175a, a driving drain electrode 175b, and a passivation layer 180.

The buffer layer 120 is disposed on the substrate 100, and may have a single layer made of a silicon nitride ($SiN_x$) or a double-layered structure in which a silicon nitride ($SiN_x$) and a silicon oxide ($SiO_x$) are laminated.

The buffer layer 120 serves to planarize a surface, while preventing or substantially preventing unnecessary materials such as impurities or moisture from permeating.

The switching and driving semiconductor layers 154a and 154b are disposed on (e.g., located at) the buffer layer 120, while being spaced apart from each other.

The switching and driving semiconductor layers 154a and 154b are made of polycrystalline silicon, and include channel regions 1545a and 1545b, source regions 1546a and 1546b, and drain regions 1547a and 1547b.

The source regions 1546a and 1546b and the drain regions 1547a and 1547b are respectively disposed on (e.g., located at) lateral sides of the channel regions 1545a and 1545b.

The channel regions 1545a and 1545b are made of polysilicon in which no impurity is doped, that is, an intrinsic semiconductor. The source regions 1546a and 1546b and the drain regions 1547a and 1547b are made of polysilicon in which conductive impurities are doped, that is, an impurity semiconductor.

The gate insulation layer 140 is disposed on (e.g. located at) the channel regions 1545a and 1545b of the switching and driving semiconductor layers 154a and 154b.

The gate insulation layer 140 may be a single layer, or multiple layers containing at least one of a silicon nitride and a silicon oxide.

The gate lines 121 are disposed on (e.g., located at) the gate insulation layer 140, and the first storage capacitor plate 128 is disposed on (e.g., located at) the buffer layer 120.

The gate lines 121 extend in a horizontal direction to transmit a gate signal, and include a switching gate electrode 124a protruding towards the switching semiconductor layer 154a from the gate lines 121.

The first storage capacitor plate 128 includes a driving gate electrode 124b that protrudes therefrom towards the driving semiconductor layer 154b.

The switching gate electrode 124a and the driving gate electrode 124b respectively overlap the channel regions 1545a and 1545b.

The interlayer insulation layer 160 is disposed on (e.g., located at) the gate lines 121, the first storage capacitor plate 128, and the buffer layer 120.

A switching source contact hole 61a and a switching drain contact hole 62a are formed on the interlayer insulation layer 160 to expose the source region 1546a and the drain region 1547a of the switching semiconductor layer 154a, respectively.

In addition, a driving source contact hole 61b and a driving drain contact hole 62b are further formed on the interlayer insulation layer 160 to expose the source region 1546b and the drain region 1547b of the driving semiconductor layer 154b, respectively.

The data lines 171, the driving voltage lines 172, the switching drain electrode 175a, and the driving drain electrode 175b are disposed on (e.g., located at) the interlayer insulation layer 160.

The data lines 171 transmit a data signal and extend in a direction crossing the gate lines 121. The data lines 171 include a switching source electrode 173a protruding towards the switching semiconductor layer 154a from the data lines 171. The driving voltage lines 172 transmit a driving voltage, and are separated from the data lines 171 and extend in the same direction as the data lines 171.

The driving voltage lines 172 include a driving source electrode 173b protruding towards the driving semiconductor layer 154b from the driving voltage lines 172, and a second storage capacitor plate 178 protruding from the driving voltage lines 172 to overlap the first storage capacitor plate 128.

In the described example embodiment, the first storage capacitor plate 128 and the second storage capacitor plate 178 form the storage capacitor Cst by using the interlayer insulation layer 160 as a dielectric material therebetween.

The switching drain electrode 175a faces the switching source electrode 173a, and the driving drain electrode 175b faces the driving source electrode 173b.

The switching source electrode 173a and the switching drain electrode 175a are coupled to the source and drain regions 1546a and 1547a of the switching semiconductor layer 154a through the switching source contact hole 61a and the switching drain contact hole 62a, respectively.

In addition, the switching drain electrode 175a is elongated to be electrically coupled (e.g., electrically connected) to the first storage capacitor plate 128 and the driving gate electrode 124b through a first contact hole 63 formed on the interlayer insulation layer 160.

The driving source and drain electrodes 173b and 175b are coupled to the source and drain regions 1546b and 1547b of the driving semiconductor layer 154b through the driving source and drain contact holes 61b and 62b, respectively.

The switching semiconductor layer 154a, the switching gate electrode 124a, the switching source electrode 173a, and the switching drain electrode 175a form the switching thin film transistor Qs, and the driving semiconductor layer 154b, the driving gate electrode 124b, the driving source electrode 173b, and the driving drain electrode 175b form the driving thin film transistor Qd.

The passivation layer 180 is formed on the data lines 171, the driving voltage lines 172, the switching drain electrode 175a, and the driving drain electrode 175b.

A second contact hole 185 is formed on the passivation layer 180 to expose the driving drain electrode 175b.

An organic light emitting diode LID and a pixel definition layer 350 are disposed on the passivation layer 180.

The organic light emitting diode LD includes a pixel electrode 191, an organic emission layer 360, and a common electrode 270.

The pixel electrode 191 is located at the passivation layer 180 and is electrically coupled to the driving drain electrode 175b of the driving thin film transistor Qd through the second contact hole 185 formed at the passivation layer 180.

The pixel electrode 191 may be an anode of the organic light emitting diode LD.

The pixel electrode 191 may be made of a transparent conductive material such as indium tin oxide (ITO), indium zinc oxide (IZO), zinc oxide (ZnO), and/or indium oxide (In2O3), or may be made of a reflective metal such as lithium (Li), calcium (Ca), lithium fluoride/calcium (LiF/Ca), lithium fluoride/aluminum (LiF/AI), aluminum (Al), silver (Ag), magnesium (Mg), or gold (Au).

The pixel definition layer 350 is disposed on (e.g., located at) edge portions of the pixel electrode 191 and the passivation layer 180.

The pixel definition layer 350 has an opening through which the pixel electrode 191 is exposed.

The pixel definition layer 350 may be made of a polyacryl-based resin or a polyimide-based resin.

The organic emission layer 360 is disposed on (e.g., located at) the pixel electrode 191 at the opening of the pixel definition layer 350.

The organic emission layer 360 may include multiple layers including one or more selected among an emission layer, a hole-injection layer (HIL), a hole-transporting layer (HTL), an electron-transporting layer (ETL), and an electron-injection layer (EIL).

When the organic emission layer 360 includes all of the above layers, the hole-injection layer is disposed on the pixel electrode 191 as the anode, and the hole-transporting layer, the emission layer, the electron-transporting layer, and the electron-injection layer may be sequentially laminated on the hole-injection layer.

The organic emission layer 360 may include a red organic emission layer for emitting red light, a green organic emission layer for emitting green light, or a blue organic emission layer for emitting blue light. The red organic emission layer, the green organic emission layer, and the blue organic emission layer may be respectively formed on a red pixel, a green pixel, and a blue pixel to implement a color image.

Further, the red organic emission layer, the green organic emission layer, and the blue organic emission layer may be integrally laminated on the organic emission layer 360 together with the red pixel, the green pixel, and the blue pixel, to respectively form a red color filter, a green color filter, and a blue color filter in each pixel so as to implement a color image.

Alternatively, a white organic emission layer for emitting white light may be formed on all of the red pixel, the green pixel, and the blue pixel, and a red color filter, a green color filter, and a blue color filter may be respectively formed for every pixel to implement a color image.

When the color image is implemented by using the white organic emission layer and the color filters, a deposition mask for depositing the red organic emission layer, the green organic emission layer, and the blue organic emission layer on individual pixels, that is, the red pixel, the green pixel, and the blue pixel, may not be required.

In another example embodiment, the white organic emission layer may be formed to have a single organic emission layer, and may further include a configuration in which a plurality of organic emission layers are laminated to emit white light.

For example, a configuration in which at least one yellow organic emission layer and at least one blue organic emission layer are combined to emit white light, a configuration in which at least one cyan organic emission layer and at least one red organic emission layer are combined to emit white light, or a configuration in which at least one magenta organic emission layer and at least one green organic emission layer are combined to emit white light may be further included.

The common electrode 270 is disposed on the pixel definition layer 350 and the organic emission layer 360.

The common electrode 270 may be made of a transparent conductive material such as indium tin oxide (ITO), indium zinc oxide (IZO), zinc oxide (ZnO), or indium oxide (In2O3), or may be made of a reflective metal such as lithium, calcium, lithium fluoride/calcium, lithium fluoride/aluminum, aluminum, silver, magnesium, or gold.

The common electrode 270 may be a cathode of the organic light emitting diode LD.

Further, a display device according to example embodiments of the present invention may be a liquid crystal display device, a plasma display device, etc., in addition to the organic light emitting diode display described above.

Hereinafter, an example embodiment used for a liquid crystal display device will be described with reference to FIG. 12, and descriptions of the same or similar constituent elements as those of the example embodiments described above may have been omitted.

Figure 12:
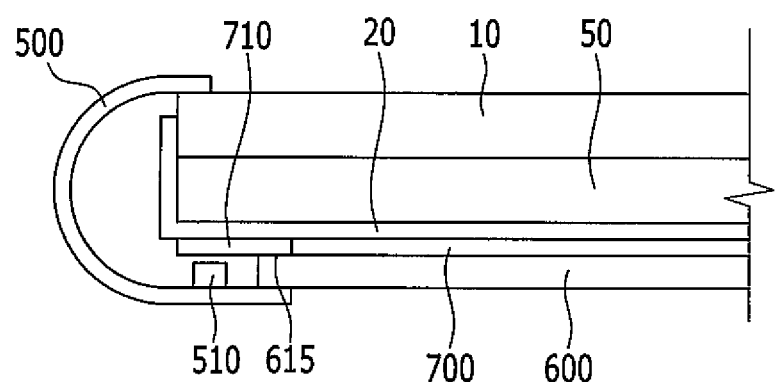
FIG. 12 is a cross-sectional view of a display device according to another example embodiment of the present invention.

FIG. 12 is a cross-sectional view of a display device according to another example embodiment of the present invention.

The display device according to an example embodiment of the present invention includes a display panel 10, a light unit 50, and a chassis 20 mounted with the display panel 10 and the light unit 50.

The display panel 10 outputs an image, and the light unit 50 may further include an optical sheet that provides light to the display panel 10 to improve efficiency of light.

The optical sheet may serve to efficiently distribute and collect light.

In an example embodiment of the present invention, the optical sheet may be additionally laminated.

The chassis 20 is mounted on a bottom surface of the light unit 50 to fix and support the light unit 50, and members such as the display panel 10 or a window positioned above the light unit 50.

A reflector may be laminated on an inner side of the chassis 20, such that light radiated in all directions, except for a direction toward the display panel 10, is reflected thereto.

Similar to example embodiments described above, the display device may include a chip on film 500 electrically coupled (e.g., electrically connected) to one end of the display panel 10, and a driving circuit 510.

As shown in FIG. 12, the chip on film 500 may be variously bent, because the chip on film 500 may be made of a bendable material such as film or tape.

The flexible printed circuit board 600 is coupled (e.g., connected) to one end of the chip on film 500, and for example, may be electrically and physically coupled thereto through an anisotropic conductive film (ACF).

In this case, the other end of the chip on film 500 is coupled to the display panel 10.

When the control and data signals are provided to the driving circuit 510 of the chip on film 500 through the flexible printed circuit board 600, the driving circuit 510 generates scan and data signals, and transmits the signals to light emitting elements of the display layer 200 through the scan and data lines.

The flexible printed circuit board 600 may be the same as or similar to the flexible printed circuit board 600 used in example embodiments described above.

That is, the flexible printed circuit board 600 may include an opening region 615 in which an insulating layer is partially removed, which may contact a conductive region 710 that will be described later.

For example, the printed circuit board 600 may include a plurality of opening regions 615, opening regions 615 positioned on opposite sides of the flexible printed circuit board 600, and/or opening regions 615 positioned on the protruding portions.

According to example embodiments of the present invention, one or more of the aforesaid embodiments may be combined in any suitable manner as would be apparent to those skilled in the art.

The protecting sheet 700 is positioned on a rear side of the display panel, that is, on one side of the chassis 20, and in an example embodiment, the protecting sheet 700 may be positioned close to one corner of the display device.

The protecting sheet 700 is formed on an entire surface of the chassis 20, and may be divided into a region having an insulating property and a conductive region 710 having a conductive property.

As the chip on film 500 and the flexible printed circuit board 600 are bent, the conductive region 710 may be formed in a region where the opening region 615 of the flexible printed circuit board 600 and the protecting sheet 700 contact each other Thus, the conductive region 710 and the flexible printed circuit board 600 may at least partially contact each other, and an example embodiment in which they completely overlap is possible.

Further, the conductive region 710 is disposed at one corner of the protecting sheet 700, for example, in a position adjacent to one corner of the display device, so as to allow static electricity introduced from the outside to be easily introduced.

Despite the small size of the device, the display device described above may stably discharge the static electricity to the conductive region 710 and the opening region 615 through which the static electricity is introduced.

Accordingly, the robust anti-static display device may be provided that prevents or reduces damage to the display panel, the driving circuits, etc., caused by the static electricity.

The accompanying drawings and the detailed description of the invention are only illustrative, and are used for the purpose of describing the present invention, but are not used to limit the meaning or scope of the present invention described in claims.

Therefore, a person having ordinary skill in the art may select and replace the example embodiments.

Further, those having ordinary skill in the art may omit a part of the constituent elements described in the present specification without deterioration of performance, or may add a constituent element for improving performance.

In addition, those having ordinary skill in the art may change a sequence of the steps of the method described in the present specification according to a process environment or equipment.

Accordingly, the spirit and scope of the present invention shall be determined by the accompanying claims and equivalents thereof, and not limited to the aforementioned example embodiments.

DESCRIPTION OF SOME OF THE SYMBOLS

| | |
|---|---|
| 10: display panel | 100: substrate |
| 200: display layer | 500: chip on film |
| 510: driving circuit | 600: flexible printed circuit board |

| | |
|---|---|
| 615: opening region | 700: protecting sheet |
| 710: conductive region | |

What is claimed is:

1. A display device comprising:
a display panel comprising a plurality of thin film transistors disposed on one side of the display panel;
a chip on film (COF) coupled to the display panel;
a flexible printed circuit board (FPCB) coupled to the chip on film, the flexible printed circuit board comprising:
   a plurality of conductive layers and a plurality of insulating layers, the plurality of insulating layers being interposed between the conductive layers or located at opposite sides of the flexible printed circuit board, one of the plurality of insulating layers disposed on one side of the flexible printed circuit board having an opening region exposing one of the conductive layers;
   a protruding portion that overlaps the chip on film; and
   a body part comprising circuit elements and being coupled to the protruding portion, the opening region being at the protruding portion; and
a protecting sheet disposed on another side of the display panel that is opposite to the one side of the display panel, and comprising a conductive region,
wherein the conductive region and the one of the conductive layers contact each other through the opening region.

2. The display device of claim 1, wherein the protecting sheet further comprises a cushion sheet having an insulating property.

3. The display device of claim 1, wherein at least one of the plurality of insulating layers comprises polyimide films.

4. The display device of claim 1, wherein the insulating layers define a plurality of via-holes.

5. The display device of claim 1, further comprising a driving circuit on the chip on film,
   wherein the protruding portion comprises a plurality of protruding portions, and
   wherein the driving circuit is between the plurality of protruding portions.

6. The display device of claim 1, wherein the opening region is configured to guide static electricity introduced into the opening region toward a ground wire at the body part.

7. The display device of claim 1, wherein one end of the protecting sheet comprises the conductive region and protrudes further than that of the display panel.

8. The display device of claim 1, wherein the opening region comprises a plurality of opening regions at the opposite sides of the flexible printed circuit board.

9. The display device of claim 8, wherein the plurality of opening regions are at a corner of the flexible printed circuit board.

10. The display device of claim 1, wherein resistances of the conductive layers are smaller than that of the conductive region.

11. The display device of claim 10, wherein the conductive region comprises a fabric and a metallic paste.

12. The display device of claim 10, wherein the conductive layers comprise at least one of copper (Cu), nickel (Ni), or gold (Au).

13. The display device of claim 1, further comprising a chassis at the display panel,
   wherein the opening region is configured to guide static electricity introduced into the opening region toward the chassis.

* * * * *